(12) United States Patent
Liu et al.

(10) Patent No.: US 7,097,744 B2
(45) Date of Patent: Aug. 29, 2006

(54) METHOD AND APPARATUS FOR CONTROLLING DARKSPACE GAP IN A CHAMBER

(75) Inventors: Alan Barry Liu, Mountain View, CA (US); Marc O. Schweitzer, San Jose, CA (US); James Stephen Van Gogh, Sunnyvale, CA (US); Michael Rosenstein, Sunnyvale, CA (US); Jennifer L. Watia, Mountain View, CA (US); Xinyu Zhang, Fremont, CA (US); Yoichiro Tanaka, San Jose, CA (US); John C. Forster, San Francisco, CA (US); Anthony Chen, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 429 days.

(21) Appl. No.: 10/460,865

(22) Filed: Jun. 12, 2003

(65) Prior Publication Data

US 2004/0251130 A1    Dec. 16, 2004

(51) Int. Cl.
*C23C 14/35* (2006.01)
(52) U.S. Cl. .............................. 204/192.12; 204/298.11
(58) Field of Classification Search ........... 204/298.11, 204/192.12
See application file for complete search history.

(56) References Cited

U.S. PATENT DOCUMENTS

| | | | |
|---|---|---|---|
| 4,802,968 A | 2/1989 | Hendrix et al. ........ 404/298.12 |
| 5,292,419 A * | 3/1994 | Moses et al. .......... 204/298.28 |
| 5,334,298 A | 8/1994 | Gegenwart ............. 204/192.12 |
| 5,518,593 A | 5/1996 | Hosokawa et al. .... 204/192.12 |
| 5,539,272 A | 7/1996 | Taylor et al. ................ 313/149 |
| 5,658,442 A | 8/1997 | Van Gogh et al. ...... 204/298.12 |
| 5,803,977 A | 9/1998 | Tepman et al. ............. 208/729 |
| 5,824,197 A * | 10/1998 | Tanaka ................... 204/192.12 |
| D401,252 S | 11/1998 | Tudhope et al. ........... D15/138 |
| D403,334 S | 12/1998 | Tudhope et al. ........... D15/138 |
| 5,863,340 A | 1/1999 | Flanigan .................... 118/728 |
| 6,030,509 A | 2/2000 | Fu-Kang et al. ....... 204/192.12 |
| 6,033,480 A | 3/2000 | Chen et al. ................. 118/715 |
| 6,051,122 A | 4/2000 | Flanigan ................ 204/298.11 |
| 6,059,945 A | 5/2000 | Fu et al. ................. 204/298.12 |
| 6,143,086 A | 11/2000 | Tepman ...................... 118/728 |
| 6,159,299 A | 12/2000 | Koai et al. .................. 118/715 |
| 6,168,668 B1 | 1/2001 | Yudovsky ................... 118/715 |
| 6,171,453 B1 | 1/2001 | Chung et al. .......... 204/192.12 |
| 6,190,513 B1 | 2/2001 | Forster et al. ......... 204/192.12 |
| 6,231,674 B1 | 5/2001 | Chen et al. ................. 118/720 |

* cited by examiner

*Primary Examiner*—Rodney G. McDonald
(74) *Attorney, Agent, or Firm*—Konrad Raynes Victor & Mann, LLP

(57) ABSTRACT

In one embodiment, a target alignment surface disposed on a target support mechanically engages a darkspace shield alignment surface disposed on a darkspace shield as the target is lodged into a chamber body. The respective alignment surfaces are shaped and positioned so that the darkspace shield is physically moved to a desired aligned position as the alignment surfaces engage each other. In this manner a darkspace shield may be directly aligned to a target within a semiconductor fabrication chamber to provide a suitable darkspace gap between the target and the darkspace shield.

47 Claims, 7 Drawing Sheets

METHOD AND APPARATUS FOR CONTROLLING DARKSPACE GAP IN A CHAMBER

BACKGROUND OF THE INVENTION

1. Field of the Invention

The invention relates to physical vapor deposition, and more particularly, to a method and apparatus for controlling a darkspace gap within a physical vapor deposition chamber.

2. Description of the Related Art

Sputtering is a physical vapor deposition (PVD) process in which high-energy ions impact and erode a solid target and deposit the target material on the surface of a substrate such as a silicon wafer. In semiconductor fabrication the sputtering process is usually accomplished within a semiconductor fabrication chamber also known as a PVD process chamber or a sputtering chamber.

A typical semiconductor fabrication chamber has a disc-shaped target of solid metal or other material supported by a backing plate that holds the target. Material sputtered from the edges of the target may contribute to a non-uniform deposition of the material on the surface of a substrate within the PVD chamber. To promote uniform deposition, the PVD chamber may have an annular concentric metallic ring often called a darkspace shield which circumferentially surrounds the disc-shaped target. The gap between the inner surface of the darkspace shield and the circumferential surface of the target is typically referred to as the darkspace gap.

In many applications, it is preferred that the darkspace gap be kept large enough to inhibit or prevent electrical arcing between the target and the darkspace shield which are often at different electrical potentials. On the other hand, it is often preferred that the darkspace gap be kept small enough to prevent PVD plasma ignition within the gap and also to reduce the amount of sputtered material entering the darkspace gap and depositing onto the circumferential surface of the target. Such depositions on the target edge may cause particle contamination on processed silicon wafers or other workpieces. To provide a suitable darkspace gap around the complete periphery of the target, proper alignment of the target and the darkspace shield is often needed. In prior sputtering chambers, the target and the darkspace shield are typically each aligned to the chamber body in which the target and darkspace shield are installed.

SUMMARY OF THE ILLUSTRATED EMBODIMENTS

Described is a system and method for directly aligning a darkspace shield to a target within a semiconductor fabrication chamber to provide a suitable darkspace gap between the target and the darkspace shield. In one embodiment, a target alignment surface disposed on a target support mechanically engages a darkspace shield alignment surface disposed on the darkspace shield. In one example, the alignment surfaces of the target and darkspace shield engage each other as the target is lodged into the chamber body. The respective alignment surfaces are shaped and positioned so that the darkspace shield is physically moved to a desired aligned position as the alignment surfaces engage each other. In the illustrated embodiment, the darkspace shield slides on a darkspace support positioned within the chamber to a position concentric with the target. Although the target and darkspace shield may be biased at substantially different electrical bias levels, the engagement mechanism between the target and darkspace shield can include insulative material to maintain suitable electrical isolation between the target and the darkspace shield.

In the illustrated embodiment, the target support has a plurality of pin-shaped alignment members, each of which defines a male, pin-shaped alignment surface. Conversely, the darkspace shield has a plurality of slotted bushings, each of which defines a female, slot-shaped alignment surface adapted to receive a target alignment member. It is recognized that the engagement mechanism may include other types of male and female members and that the male members may be carried by one or both of the target support and the darkspace shield and that the female members may be carried by one or both of the target support and the darkspace shield. It is further recognized that alignment surfaces other than male or female may be used as well.

In another aspect of the present invention, the alignment surfaces are shaped to permit a desired degree of tolerance in the alignment and also to permit expansion and contraction of the darkspace shield relative to the target as the pressure or temperature within the chamber changes. In the illustrated embodiment, the slots of the slotted bushings of the darkspace shield are generally elongated in a radial direction to facilitate relative movements in radial directions. In addition, the slots of the slotted bushings are somewhat wider than the pins of the target support to facilitate lateral shifts in position to a limited degree. In this manner, the engagement mechanism can control the darkspace gap between the darkspace shield and the target despite temperature or pressure changes in the semiconductor fabrication chamber while the chamber is operating. The design also allows the target and darkspace shield to move with respect to each other during pumpdown and thermal cycling without losing concentricity of the darkspace shield alignment with respect to the target.

In another embodiment, the engagement mechanism fastens the darkspace shield to the target support. In this embodiment, a target alignment surface disposed on the target support mechanically engages a darkspace shield alignment surface disposed on the darkspace shield to align the darkspace shield relative to the target while the darkspace shield is fastened to the target support. In one example, the darkspace shield is fastened to the target support by the engagement mechanism before the target is lodged into the chamber body.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

BRIEF DESCRIPTION OF THE DRAWINGS

Referring now to the drawings in which like reference numbers represent corresponding parts throughout.

DETAILED DESCRIPTION OF ILLUSTRATED EMBODIMENTS

Figure 1:
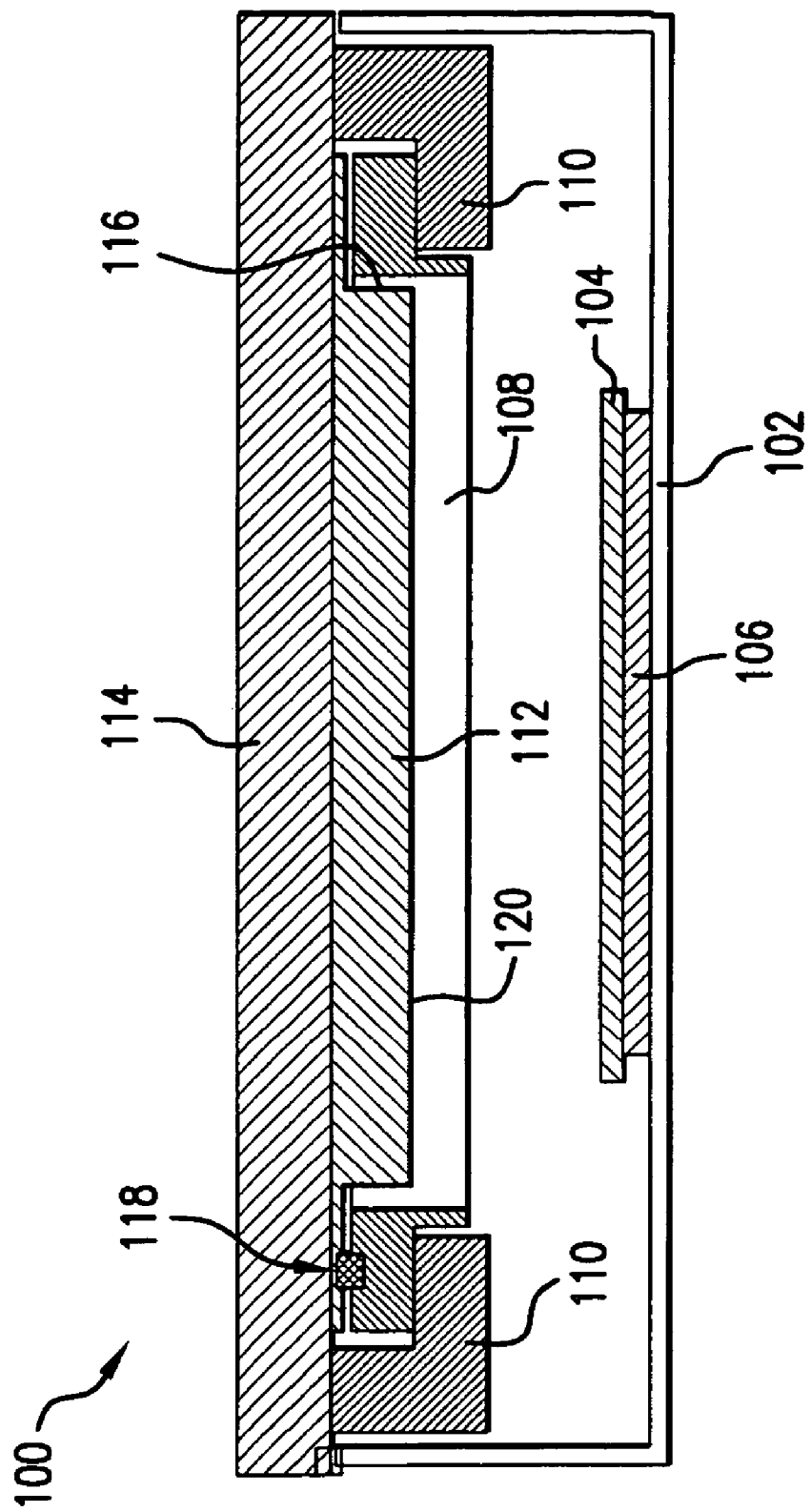
FIG. 1 is a schematic cross-sectional diagram of a semiconductor fabrication chamber, in accordance with certain described implementations of the invention.

FIG. 1 is a schematic, cross-sectional illustration of a semiconductor fabrication chamber 100 in accordance with one embodiment of the invention. The semiconductor fabrication chamber 100 comprises a chamber body 102 and a substrate 104 supported by a substrate support 106 within the chamber body 102. A darkspace shield 108 surrounds a target device which includes a target 112 supported by a target support 114. In the illustrated embodiment, the darkspace shield 108 includes a generally annular shaped metal ring that extends circumferentially around the target 112 and defines a darkspace gap 116 between the darkspace shield 108 and the edge of the target 112.

In accordance with one aspect of the present invention, the chamber 100 has an engagement mechanism 118 which mechanically couples the target 112 supported by the target support 114 to the darkspace shield 108 supported by a darkspace shield support 110. As described in greater detail below, the engagement mechanism 118 can automatically align the target 112 to the darkspace shield 108 in a manner such that the darkspace gap 116 is substantially uniform and is maintained sufficiently large to inhibit electrical arcing between the electrically biased target 112 and the darkspace shield 108. In addition, the darkspace gap 116 may also be kept small enough to inhibit PVD plasma ignition within the darkspace gap 116 and to reduce the amount of sputtered material entering the darkspace gap 116.

The target 112 is a generally disk-shaped member which has a sputterable target surface 120 which is typically fabricated of an electrically conductive target material, such as titanium, tantalum or copper, for example. The target 112 is usually joined to the target support 114 by welding, brazing, mechanical fasteners or other suitable joining techniques. The support 114 is usually fabricated from a high strength, electrically conductive metal in electrical contact with the target 112. The target 112 and the target support 114 may also be formed together as a unitary or integral structure.

During operation of the semiconductor fabrication chamber 100, the target 112 and the target support 114 are often both electrically biased at a high negative voltage to attract ions to the target sputter surface 120 to sputter material from the target 112. These ions impact the surface 120 of the target and chip off or "sputter" the target material of the target 112, atom by atom or in clusters of target material atoms. The sputtered metal deposits on the substrate 104 and forms a solid layer of metal. This layer may be patterned and etched or followed by bulk metal deposition to form the interconnecting layers in a semiconductor wafer In contrast to the target 112, the darkspace shield 108 may be at earth potential, may be floating electrically or may be biased to a relatively small voltage. Hence, there is typically a large potential difference between the target 112 and the darkspace shield 108. Consequently, the target 112 and target support 114 are usually electrically isolated from the darkspace shield 108 such that a direct electrical connection between darkspace shield and either the target or the target support through the chamber walls is often avoided. Such isolation may be provided by the shield support 110 which can electrically isolate the shield 108 from the chamber walls. Other isolators can be provided between the target support 114 and the chamber walls. In accordance with one aspect of the present invention, as explained in greater detail below, the engagement mechanism 118 can maintain suitable electrical isolation between the target 112 and target support 114 on the one hand, and the darkspace shield 108 on the other hand, while mechanically aligning the target and shield relative to each other.

It has been recognized by the present applicants that there are various causes for the imprecision in the positioning of a darkspace shield with respect to the target in prior PVD chambers. These causes include changes in temperature which typically occur within the PVD chamber. For example, a change in temperature within a PVD chamber may alter the darkspace gap because of a difference in the thermal coefficient of expansion of the material of the target and the material of the darkspace shield. As explained in greater detail below, the engagement mechanism 118 can compensate for such temperature changes while maintaining alignment between the target 112 and darkspace shield 108.

Figure 2A:
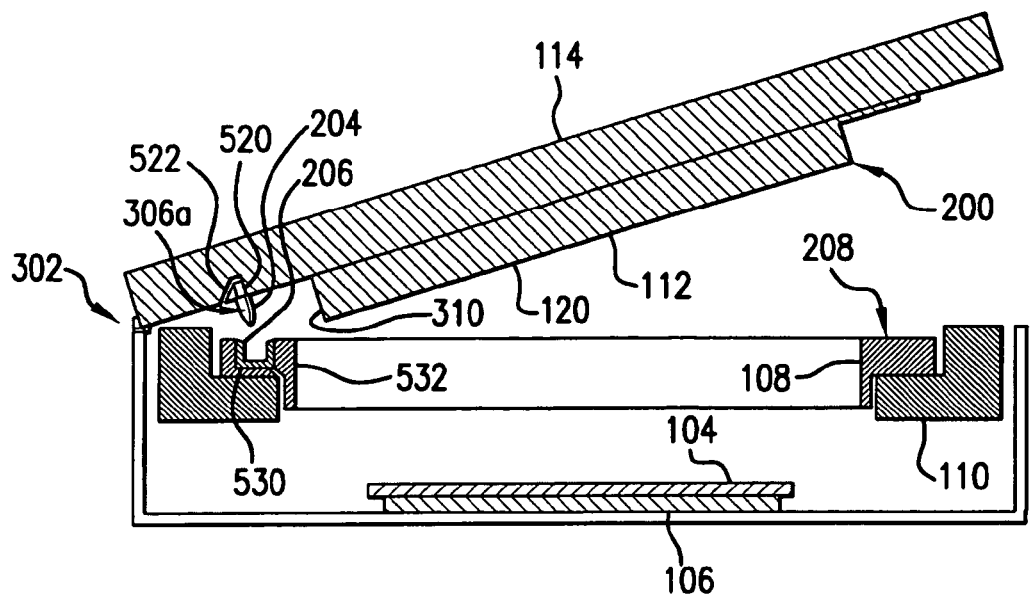
FIG. 2a is a schematic cross-sectional diagram of the semiconductor chamber of FIG. 1 in which the target is depicted in a first, open target position with respect to the chamber body of the semiconductor fabrication chamber.
Figure 2B:
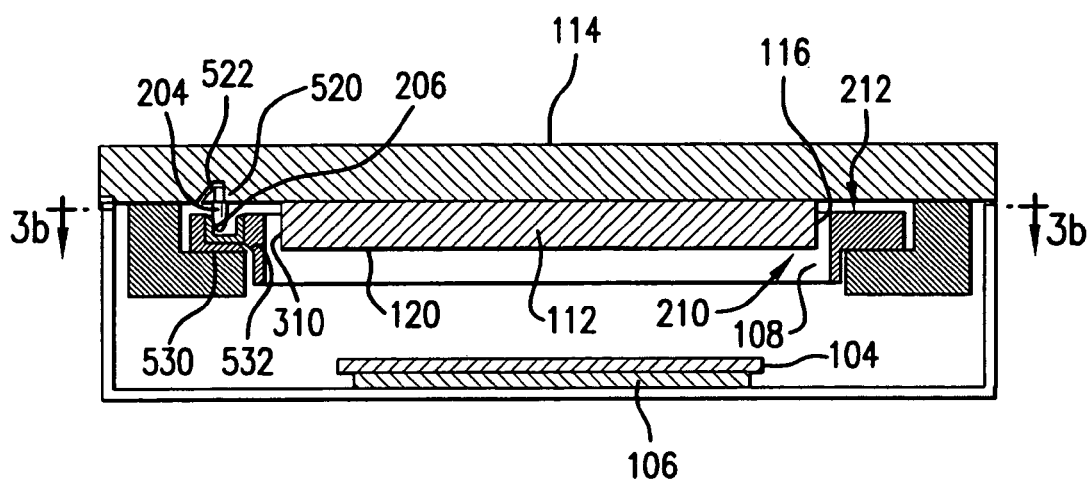
FIG. 2b is a schematic cross-sectional diagram of the semiconductor chamber of FIG. 1 in which the target is depicted in a second, closed target position with respect to the chamber body of the semiconductor fabrication chamber.

One embodiment of an engagement mechanism is schematically illustrated in FIGS. 2a and 2b. FIG. 2a illustrates a cross section of the target 112 in a first target position 200 with respect to the chamber body 102 of the semiconductor fabrication chamber 100. In this example, the target 112 is in an open position providing access to the interior of the chamber body 102.

The alignment mechanism of this embodiment includes at least one target alignment surface, an example of which is represented by a surface 204 disposed below the target support 114. The alignment mechanism further includes at least one darkspace shield alignment surface, an example of which is represented by a surface 206 disposed on the darkspace shield 108 which is illustrated in a first shield position 208 in FIG. 2a.

FIG. 2b illustrates a schematic cross section of the target 112 moved to a second target position 210 with respect to the chamber body 102 of the semiconductor fabrication chamber 100.. In this example, when the target 112 is in the second target position 210, the target is closed and installed in the chamber body 102.

If the darkspace shield 108 is misaligned within the chamber body 102 when the shield is in the first or open position 208 of FIG. 2a, the engagement mechanism 118 can automatically align the shield to the target as the target is moved to the closed or installed position. More specifically, as the target 112 is moved from the first target position 200 (FIG. 2a) to the second target position 210 (FIG. 2b), the target alignment surface 204 will engage the darkspace shield alignment surface 206, thereby causing the darkspace shield 108 to be moved from the first shield position 208 (FIG. 2a) to a second shield position 212 (FIG. 2b). In this example, the darkspace shield support 110 supports the darkspace shield 108 in a manner which permits the darkspace shield 108 to slide from one position to another. In addition, the respective alignment surfaces 204 and 206 are shaped and positioned so that the darkspace shield 108 will be aligned with respect to the target 112 when the darkspace shield is moved to the second shield position 212.

On the other hand, if the darkspace shield 108 is already aligned within the chamber when the darkspace shield is in the first shield position 208, then as the target 112 moves from the first target position 200 to the second target position 210 there is little or no shift in the position of the darkspace shield. Instead, the respective alignment surfaces 204 and 206 are shaped and positioned so that the darkspace shield 108 will remained aligned with respect to the target 112 as the target is moved to the second target position 210.

Figure 3A:
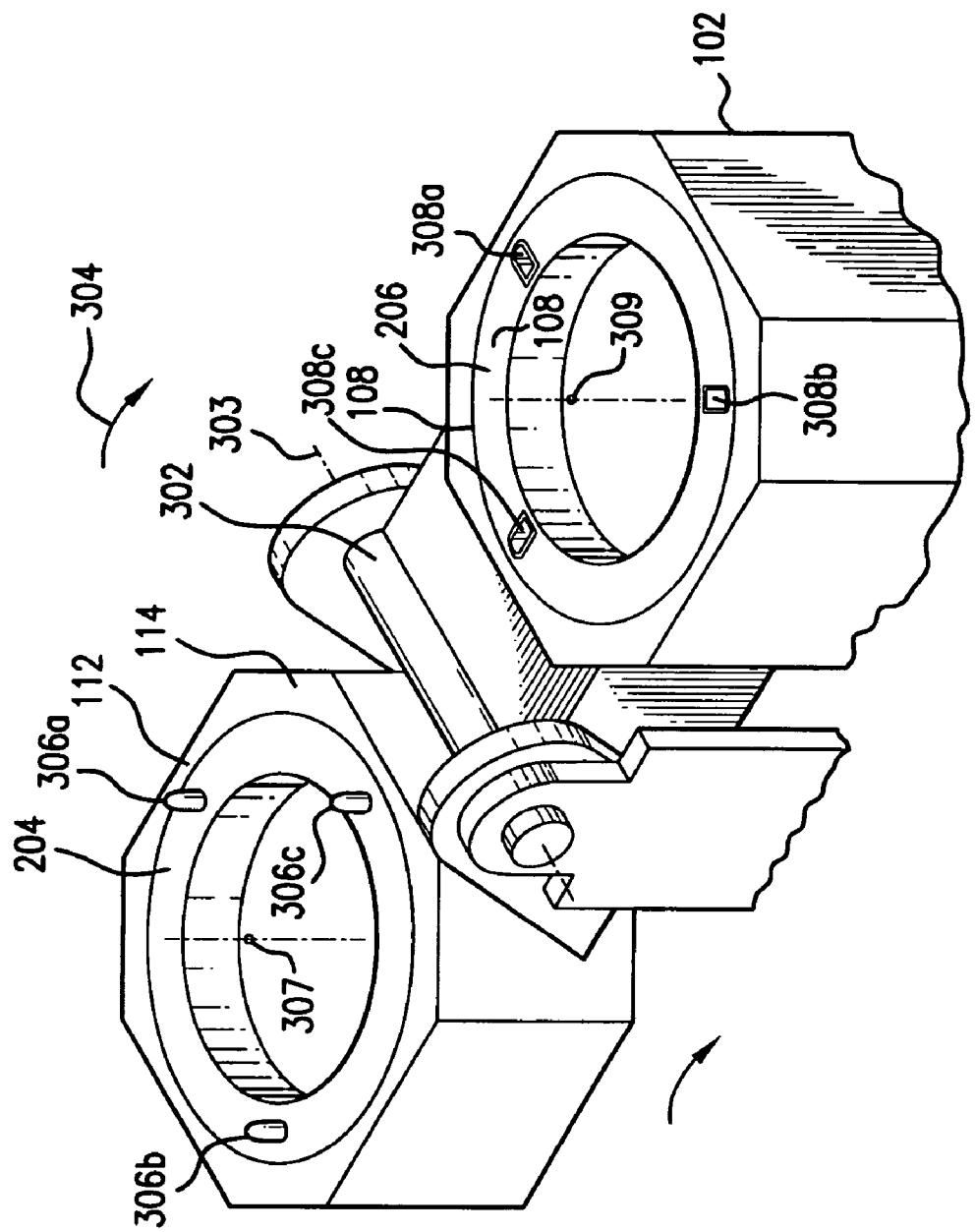
FIG. 3a is a perspective view of the semiconductor chamber of FIG. 1 in which the target is depicted in an open target position with respect to the chamber body of the semiconductor fabrication chamber.

FIG. 3a illustrates a perspective view of the semiconductor fabrication chamber 100 illustrating an open position of the target 112 relative to the chamber body 102 and the darkspace shield 108. In the example of FIG. 3a, the target support 114 serves as a lid for the chamber 100. A hinge 302 rotatably connects the target support 114 to the chamber body 102. The target support 114 may be rotated on the hinge 302 about an axis of rotation 303 until the target support 114 is closed on the chamber body 102. This rotational movement of the target support 114 to close in on the chamber body 102 is indicated by the curved arrow 304. When the target support 114 is closed on the chamber body, the chamber 100 may be pressure sealed.

Figure 3B:
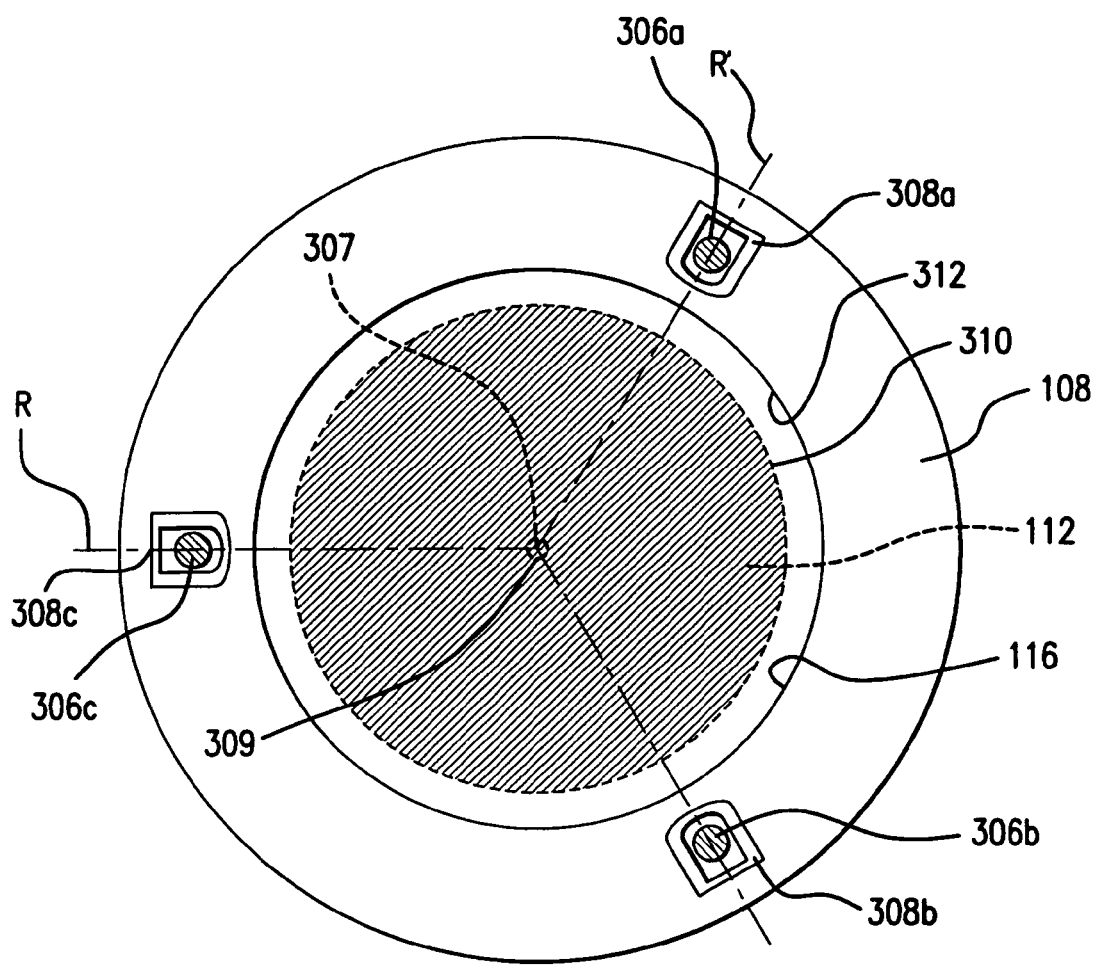
FIG. 3b is a schematic cross-sectional view of the darkspace shield of the semiconductor fabrication chamber of FIG. 1 as viewed along the line 3b—3b of FIG. 2b.
Figure 4A:
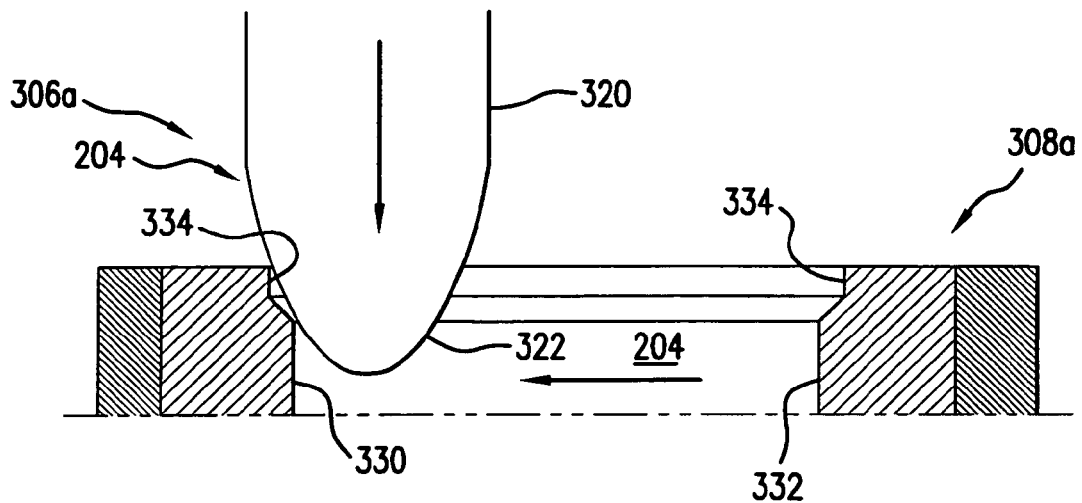
FIG. 4a is an enlarged cross-sectional view of a slotted bushing of the darkspace shield of FIG. 3b.
Figures 4B, 4C:
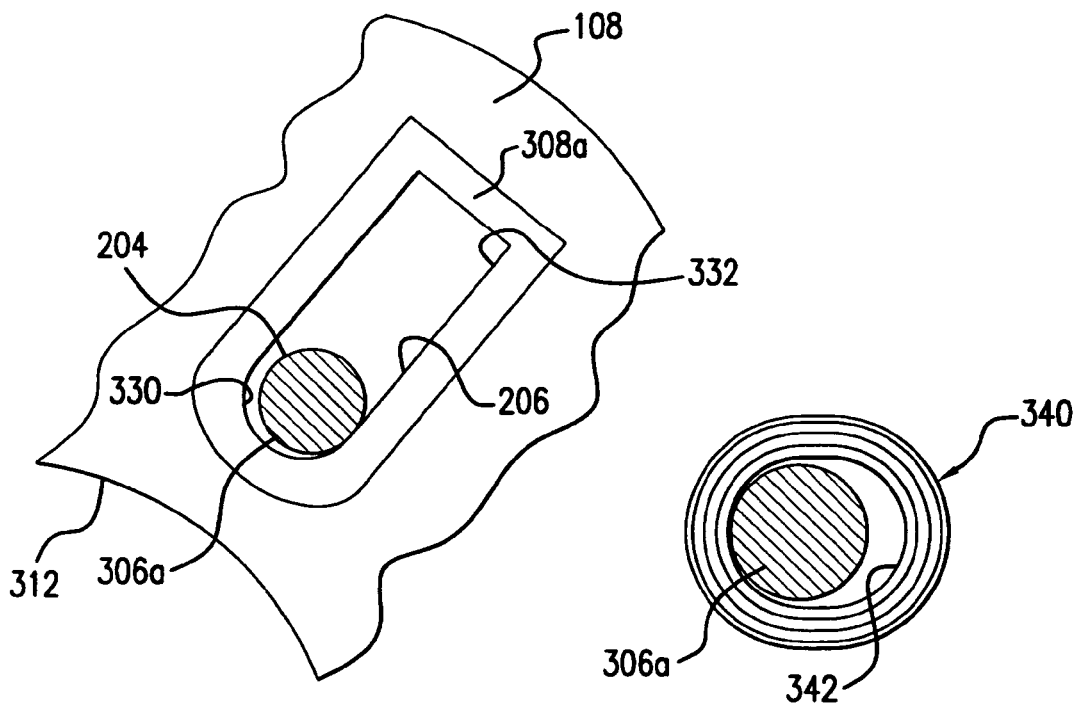
FIG. 4b is a schematic top view of a slotted bushing of the darkspace shield of FIG. 3b.
FIG. 4c is a top view of a slotted bushing in accordance with an alternative embodiment.

In the embodiment of FIGS. 3a and 3b, the target 112 has a plurality of target alignment members 306a, 306b, 306c, each of which defines a target alignment surface 204 as shown for the alignment member 306a, for example, in FIGS. 4a and 4b. In this example, the target alignment members 306a, 306b, 306c are three in number and are circumferentially located on the target support 114 outside the target sputtering surface 120. As best seen in the cross-sectional view of FIG. 3b, the target alignment members 306a, 306b, and 306c are positioned in a triangular shaped pattern equidistant from each other and equidistant from the center 307 of the target sputtering surface 120. In alternative implementations the target alignment members 306a, 306b and 306c may be fewer or greater in number and may be located in a variety of positions on the target 112 or target support 114.

In this embodiment, the darkspace shield 108 has a plurality of darkspace shield alignment members 308a, 308b, 308c, each of which defines a darkspace shield alignment surface 206 as shown for the darkspace shield alignment member 308a, for example in FIGS. 4a and 4b. In this example, the darkspace shield alignment members 308a, 308b, 308c correspond in number to the target alignment members 306a, 306b and 306c. As best seen in the cross-sectional view of FIG. 3b, each shield alignment member is positioned to receive a corresponding target alignment member as the target support 114 is moved from the open position to a closed position. Hence, in the illustrated embodiment, the shield alignment members 308a, 308b and 308, like the target alignment members 306a, 306b and 306c, are three in number and are also circumferentially located on the darkspace shield. The darkspace alignment member 308a, 308b, and 308c are positioned in a triangular shaped pattern equidistant from each other around the darkspace shield and equidistant from the center axis 309 of the darkspace shield 108. In alternative implementations the darkspace shield alignment members 308a, 308b and 308c may be fewer or greater is number and may be located in a variety of positions on the darkspace shield 108.

In the illustrated embodiment, as best seen in FIG. 3b, a darkspace gap 116 is defined between an outer peripheral surface 310 of the target 112, and the inner peripheral surface 312 of the darkspace shield 108, when the target 112 is in the closed position such that the surfaces 310 and 312 face each other. The darkspace shield 108 is considered to be aligned with respect to the target 112 when the darkspace gap 116 has certain properties. For example, it is preferred that the darkspace gap 116 be present (that is, of nonzero size) around the entire periphery 310 of the sputterable target surface 120 when the target 112 is installed in the chamber body 102. In addition, it is preferred that the size of the gap 116 be relatively consistent in size around the entire periphery 310. Still further, it is preferred that the size of the gap be of a particular value, depending upon the particular application.

In the illustrated embodiment, the darkspace gap 116 is preferably kept sufficiently large to prevent electrical arcing between the target 112 and the darkspace shield 108. In addition, the darkspace gap 116 is preferably kept sufficiently small to inhibit plasma ignition within the gap and to reduce the amount of sputtered material entering the darkspace gap. As previously mentioned, material depositing onto the circumferential surface of the target can cause particle contamination on processed silicon wafers. The dimensions of the darkspace gap 116 may vary in different implementations and may depend on process pressure, voltages and other factors. For example, the darkspace gap may range from 50–70 thousandth of an inch.

In the illustrated embodiment, a suitable darkspace gap may be achieved when center axis 309 of the darkspace shield is co-linear, that is, passes through the center 307 of the target 112 as shown in FIG. 3b or is sufficiently close within a desired tolerance. In this position, the darkspace shield is positioned concentrically with respect to the target. If the darkspace shield 108 is not sufficiently concentric with respect to the target 112, one area of the darkspace gap 116 may be too large (potentially resulting in poor particle performance) while another area of the gap may be too small (potentially resulting in arcing). Therefore, it is preferred that the darkspace gap 116 be maintained relatively consistent in size around the outer periphery of the target 112 and the inner periphery of the darkspace shield.

As best seen in FIGS. 4a and 4b, the alignment surface 204 of each target alignment member of the illustrated embodiment is generally pin-shaped and includes a generally cylindrically-shaped body portion surface 320 and a generally conical-spheroid shaped tip portion surface 322. In this example, each darkspace alignment member 308a, 308b, 308c is a slotted bushing which is preferably made of an electrically insulative material such as a ceramic. The alignment surface 206 of each darkspace shield alignment member is generally slot-shaped and includes a generally arc-shaped slot portion 330 and a generally rectangular-shaped portion 332.

As the target 112 is closed onto the chamber body 102, one or more of the target alignment member tip surfaces 322 will engage a corresponding darkspace shield alignment surface 206 as shown in FIGS. 4a and 4b, if the darkspace shield is misaligned with respect to the target 112. As the target continues to move vertically downward to the closed position, the curved target alignment member tip surface 322 continues to engage the corresponding darkspace shield alignment surface 206 and slides into the slot of the slotted bushing darkspace shield member, thereby causing the darkspace shield to slidingly shift laterally to the aligned position illustrated in FIG. 3b. The lateral shifting of the darkspace shield is facilitated by the curved conical and spheroidal shapes of the target alignment tip surface 322 and the curved slot surface 330 of the darkspace shield alignment member. The lip or leading edges 334 of the slot surfaces 330 and 332 at the entrance of each slot may recessed as shown in FIG. 4a to slope the entrance to the slot of the slotted bushing to further facilitate lateral shifting of the shield.

It is recognized that the target alignment members and darkspace shield alignment members may have a variety of other shapes, depending upon the particular application. FIG. 4c shows an example of a slotted bushing 340 having a recessed, generally oval shaped slot 342. Other shapes including rectangular, trapezoidal and round shapes may also satisfactorily convert motion of the target to motion of the darkspace shield to align the darkspace shield relative to the target.

Because the alignment surface of the slotted bushing is made of an insulative material, the target alignment surface can contact the shield alignment surface without causing an electrical short between the target or target support and the darkspace shield. It is appreciated that the alignment surface of the target alignment members may also be made of an insulative material such as a ceramic, either in addition to the insulative material of the darkspace shield alignment surfaces or in addition thereto. It is further appreciated that the target and darkspace shield alignment surfaces may both be formed of conductive materials if one or both of the alignment surfaces is suitably insulated from the target or darkspace shield.

In the illustrated embodiment, the darkspace shield 108 is made of a material capable of expansion and contraction in response to changes in temperature within the chamber body 102. In a similar manner, the target 112 may expand and contract in response to temperature changes. As a result, changes in temperature can cause the darkspace shield to shift among a plurality of thermally induced positions relative to the target. In the illustrated embodiment, each of the slot shaped darkspace shield alignment surfaces 204 is longer than it is wide and is oriented radially with respect to the darkspace shield center axis 309 as represented by a radius R, for example, in FIG. 3b. The length of each slot shaped darkspace shield alignment surface is preferably at least 25% to 200% longer than the width of the pin shaped target alignment surface 204 of each corresponding target alignment member as shown in FIGS. 4c and 4b, respectively. Such a slot length can accommodate substantial expansion and contraction of the target and darkspace shield in the radial direction due to temperature or pressure changes while maintaining alignment between the target and darkspace shield.

It is recognized that thermal contraction and expansion may occur in directions other than radially. Such nonradial movement may result from the centers of the target and darkspace shield being somewhat off centered with respect to each other but still within an acceptable tolerance for example. Thermally induced movements in nonradial directions may also result from nonradially symmetric configurations or other factors. To accommodate nonradial contraction and expansion, it is preferred that the width of each slot shaped darkspace shield alignment surface 204 be somewhat greater than the width of the target alignment member as shown in FIG. 3b. In the illustrated embodiments, the width of each slot shaped darkspace shield alignment surface 204 is approximately 5% wider the width of the target alignment member as shown in FIGS. 4b or 4c. Widths in a range of 5–15 thousands of an inch may also be suitable for accommodating nonradial thermal movements as well as to provide a degree of tolerance for target-shield alignments which are not exact.

Figure 5:
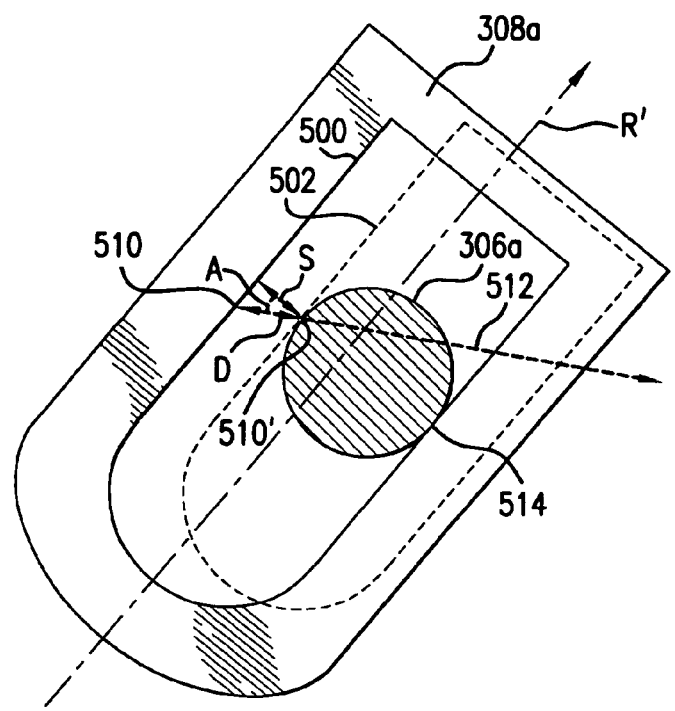
FIG. 5 is a schematic diagram of the slotted bushing of FIG. 4b illustrating calculation of a tolerance value.

FIG. 5 illustrates one example in which a tolerance may be calculated to provide the degree of desired freedom of movement of the darkspace shield relative to the target in a nonradial direction. In this example, as a result of expansion or contraction or as a result of other tolerance allowances, the slotted bushing 308a of the darkspace shield 108 moves from a first darkspace shield position 500 to a darkspace shield position 502 (shown in phantom) relative to the target 112. Thus, a point 510 on the darkspace shield alignment surface 206 shifts a distance D in a direction represented by a vector 512 to a new location 510' as the darkspace shield shifts from position 500 to position 502. The vector 512 is parallel to the radius R of FIG. 3b in this example. Darkspace shield slotted bushing 308c is aligned with radius R such that relative movement between the target and darkspace shield in the direction of radius R and (and parallel vector 512) is not impeded by the bushing 308c. Hence, it is believed that for movement in the direction of vector 512 (or any direction aligned with a slot of an alignment bushing), the engagement mechanism 118 of the illustrated embodiment permits a maximum of relative movement between the target and darkspace shield.

In the first position shield position 500, the target alignment member 306a is in contact with one side of the darkspace shield alignment surface 206 at a point 514 on one side of the alignment surface 206 of the alignment member 306a. When the darkspace shield shifts in the direction of vector 512 to the second position 502, the opposite side of the target alignment member 306a is in contact with the opposite side of the darkspace shield alignment surface 206 at the point 510', limiting further movement of the shield. Hence, it is believed that the distance D between contact points in the direction of vector 512 represents the maximum permitted shifting of the darkspace shield.

It is seen that the value of the maximum permitted shifting distance D is a function of the width of the shield alignment slot 206 relative to the width of the target alignment member. Thus, the difference between the width of the shield alignment slot 206 and the width of the target alignment member 306a is represented by the distance S in FIG. 5. The distance S represents the lateral tolerance in a direction perpendicular to the radial direction R' to which the shield alignment bushing 308a is aligned. The distance S may be calculated as $S=D*\cos A$ where $A=30$ degrees (where the alignment members are arranged in an equilateral triangle as noted above).

Thus, if the width of each slotted bushing is greater than the width of the associated target alignment member by a distance S, the darkspace shield may shift a maximum distance $D=S/(\cos(30 \text{ degrees}))$ relative to the target in the illustrated embodiment, while the target alignment member remains fully received within the darkspace shield slotted bushing. Designing the slotted bushings 306a, 306b, 306c and the pins 308a, 308b, 308c in such a manner permits the target 112 to be aligned to the darkspace shield 108 as the target lid is closed. In addition, the concentricity of the darkspace shield 108 to the target 112 is maintained within the desired tolerance as the darkspace shield shifts due to temperature or pressure changes within the semiconductor fabrication chamber 100.

Although the implementations have been described with three pins and three slotted bushing alternate implementations may have a different number of pins and slotted bushings. For example, it is believed that, two slotted bushings and two associated pins are sufficient to align and center the target 112 to the darkspace shield 108 when the target 112 is closed onto the chamber body.

In FIGS. 4a, 4b, 4c the target alignment members 306a, 306b, 306c are male type pins and the darkspace shield alignment members 308a, 308b, 308c are female type slotted bushings. In alternative implementations of the inventions, the target alignment members 306a, 306b, 306c may be slotted bushings and the darkspace shield alignment members 308a, 308b, 308c may be pins. It is recognized that the engagement mechanism may include other types of male and female members and that the male members may be carried by one or both of the target support and the darkspace shield and that the female members may be carried by one or both of the target support and the darkspace shield. It is further recognized that alignment surfaces other than male or female may be used as well.

In the illustrated embodiment, the target alignment members 306a, 306b and 306c are affixed to the target support 114 in suitable mounting holes 520 as shown for the target alignment pin 306a in FIG. 2a. Each mounting hole 520 may be vented by a vent channel 522. In a similar manner, darkspace shield alignment members 308a, 308b and 308c are affixed to the darkspace shield 108 in suitable mounting holes 530 as shown for the darkspace shield slotted bushing 308a in FIG. 2a. Each mounting hole 530 may be vented by a vent channel 532.

In alternative implementations, the target support 114 may not be hinged to the chamber body 102. Instead, the target support 114 may be detachable from the chamber body 102. In such a case, the target support 114 may be lowered vertically into the chamber body 102 and the target 112 aligned with the darkspace shield 108.

Figure 6A:
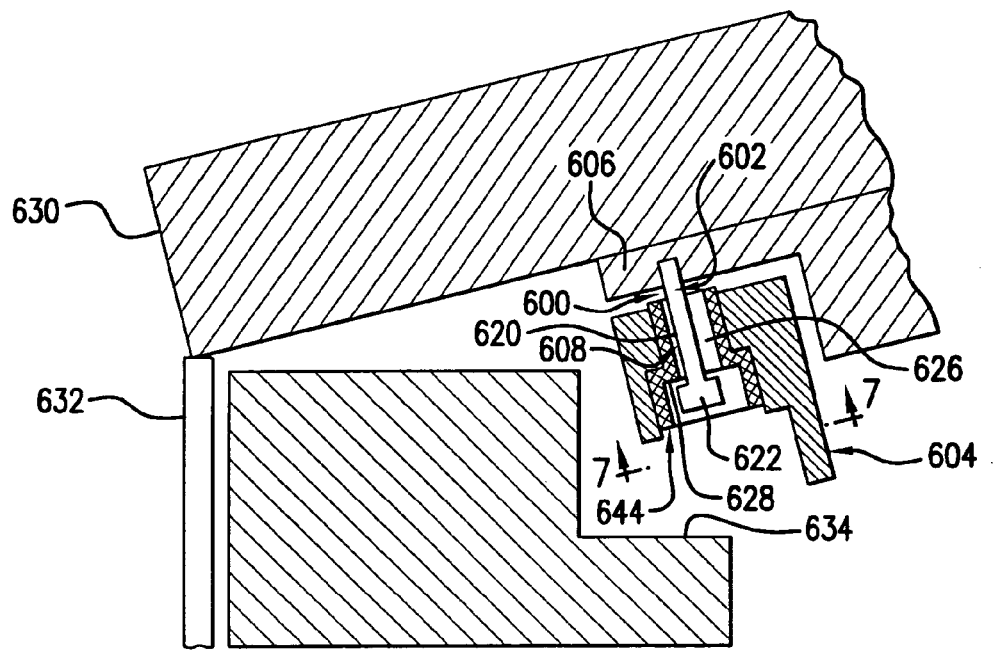
FIG. 6a is a schematic cross-sectional diagram of an alternative embodiment of an alignment mechanism used in a semiconductor chamber in which the target is depicted in a first, open target position with respect to the chamber body of the semiconductor fabrication chamber.
Figure 6B:
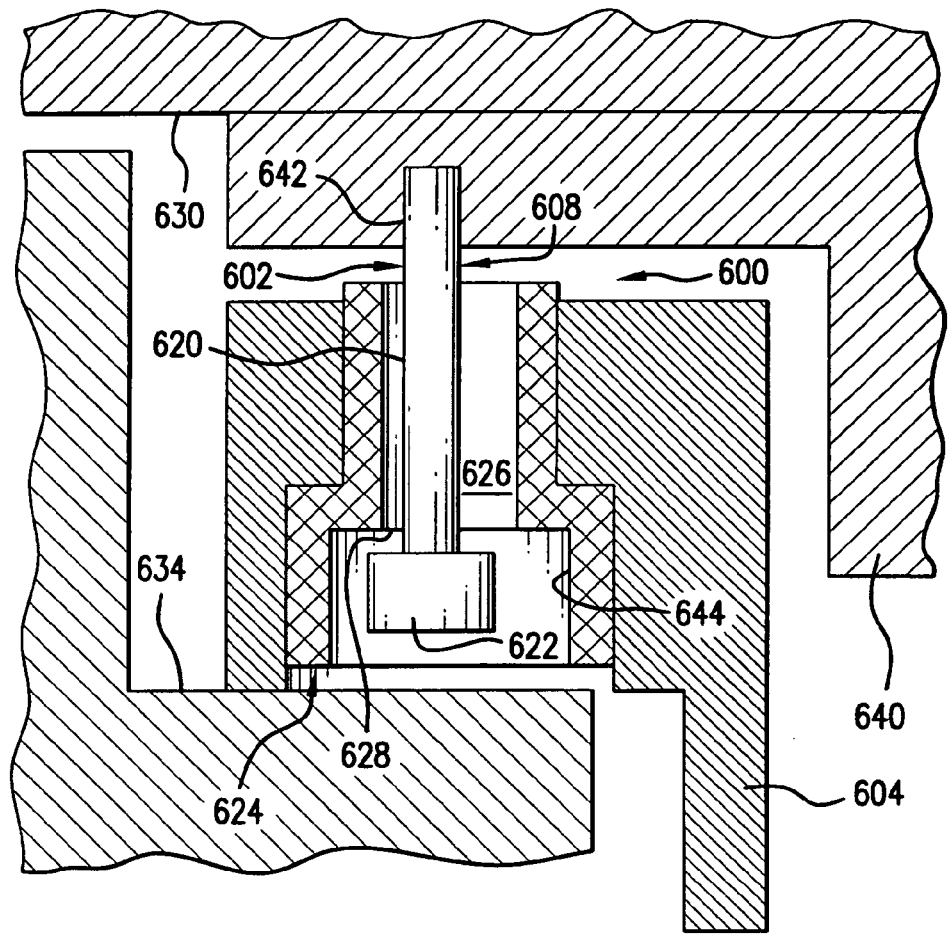
FIG. 6b is a schematic cross-sectional diagram of the semiconductor chamber of FIG. 6a in which the target is depicted in a second, closed target position with respect to the chamber body of the semiconductor fabrication chamber.

FIGS. 6a and 6b show yet another alternative embodiment in which an engagement mechanism 600 includes a target alignment member 602 similar to the target alignment members 306a, 306b, 306c of FIGS. 3a, 3b. However, the target alignment member 602 also functions as a fastener to loosely fasten the darkspace shield 604 to the target support 606 to which each target alignment member 602 is attached. The alignment surface 608 of each target alignment member 602 of the illustrated embodiment is generally pin-shaped and includes a generally cylindrically-shaped body portion surface 620 and an enlarged, removable head portion 622. In this example, each darkspace alignment member 624 is a slotted bushing which is preferably made of an electrically insulative material such as a ceramic. The alignment surface 626 of each darkspace shield alignment member is generally slot-shaped in a manner similar to that of the alignment surface 342 of FIG. 4c. Each target alignment member 602 is received in the slot 626 of an associated darkspace shield alignment member 624.

Figure 7:
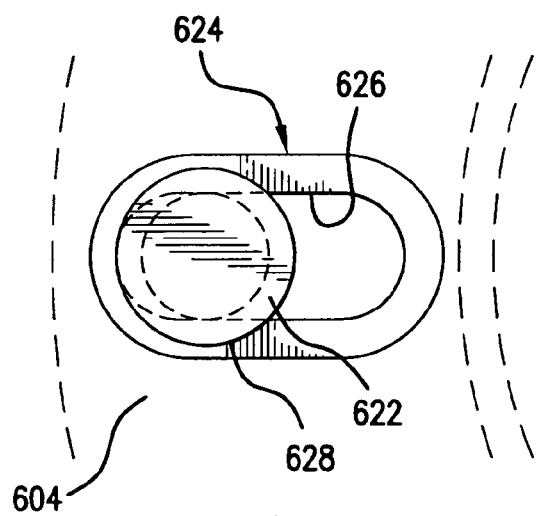
FIG. 7 is a bottom view of an alignment member and slotted bushing of FIG. 6a as viewed along the line 7—7.

As best seen in FIG. 7, the width of the head portion 622 of each target alignment member 602 is larger than that of the slot defined by the alignment surface 626. As a consequence, the head portion 622 engages an outer shoulder 628 of the bushing 624 and prevents the target alignment member 602 from being withdrawn through the slot defined by the darkspace shield alignment surface 626. In this manner, the darkspace shield 604 is supported by the target alignment members 602 when the target support 606 is in the open position illustrated in FIG. 6a. In this position the chamber lid 630 to which the target support 606 is attached, is rotated or otherwise disposed away from the chamber body 632 to provide access to the interior of the chamber.

As the chamber lid 630 is closed to seal with the chamber body 632, the target support 606 is moved toward a second position illustrated in FIG. 6b. As the target support 606 is moved toward this position, the darkspace shield 604 engages a shield support 634 which supports the shield 604 in the second position illustrated in FIG. 6b. In addition, the fastener head portion 622 of the target alignment member 602 disengages the darkspace shield bushing 624 but remains in a recessed portion 644 of the bushing 624.

The respective alignment surfaces 608 and 626 are shaped and positioned so that the darkspace shield 604 will be aligned with respect to the target 640 when the darkspace shield 604 is fastened to the target support 606 using the target alignment members 602. The alignment is maintained as the target 640 is moved to the second target position.

To assemble the darkspace shield to the target support, the removable head portions 622 are removed from each target alignment member 602 and each target alignment member 602 is passed through the slot 626 of a shield bushing 624. The head portion 622 may then be reattached to each member 602 to secure the dark space shield in place. The head portions 622 may be removably attached by, for example, threading the member ends and threading a receiving aperture in the head portion 622 for example. Other methods may be used to removably or permanently attach the head portions to the alignment members.

Alternatively, one end 642 of each member 602 may be removably attached to the target support 606 with the other, enlarged portion 622 extending into a recessed bottom portion 644 of the bushing 624. The alignment members 602 may be removably attached by, for example, threading the member ends 642 and threading a receiving aperture in the target support 606 for example. Other methods may be used to removably or permanently attach the members to the support.

It is recognized that the target alignment members 602 and darkspace shield alignment members 624 may have a variety of other shapes, depending upon the particular application. FIG. 7 shows an example of a slotted bushing 624 having a generally oval shaped slot 626. Other shapes including rectangular, trapezoidal and round shapes may also satisfactorily align the darkspace shield relative to the target.

It is appreciated that either or both of the alignment surface 608 of the target alignment members 602 and the alignment surface 626 of the darkspace shield may be made of an insulative material such as a ceramic. It is further appreciated that the target and darkspace shield alignment surfaces may both be formed of conductive materials if one or both of the alignment surfaces is suitably insulated from the target or darkspace shield.

As previously mentioned, changes in temperature can cause the darkspace shield to shift among a plurality of thermally induced positions relative to the target. In this embodiment, each of the slot shaped darkspace shield alignment surfaces 626 is longer than it is wide and is oriented radially with respect to the darkspace shield center axis. Such a slot length can accommodate substantial expansion and contraction of the target and darkspace shield in the radial direction due to temperature or pressure changes while maintaining alignment between the target and darkspace shield.

The embodiment of FIGS. 6a, 6b and 7 has three equally spaced pins 602 and three slotted bushings 624 positioned to receive the pins 602 in a manner similar to that illustrated in FIG. 3b. It is recognized that alternative implementations may have different positionings or a different number of pins and slotted bushings. Furthermore, in alternative implementations, the target alignment members 602 may be slotted bushings and the darkspace shield alignment members 624 may be pins. It is recognized that the engagement mechanism 600 may include other types of male and female members and that the male members may be carried by one or both of the target support and the darkspace shield and that the female members may be carried by one or both of the target support and the darkspace shield. It is further recognized that alignment surfaces other than male or female may be used as well.

It will, of course, be understood that other modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A semiconductor fabrication chamber, comprising:
a chamber body;
a target device having a target which has a sputterable target surface, said target device further having at least one target alignment surface and a target support supporting said target and target alignment surface, said target device being movable between a first target position and a second target position with respect to said chamber body; and
a darkspace shield positioned in said chamber body and movable between a first shield position and a second shield position with respect to said target, said darkspace shield having at least one darkspace shield alignment surface adapted to be engaged by said target alignment surface wherein said target alignment surface engages said darkspace shield alignment surface and moves said darkspace shield from said first shield position to said second shield position with respect to said target as said target moves from said first target position to said second target position with respect to said chamber body.

2. The semiconductor fabrication chamber of claim 1, further comprising:
a plurality of darkspace shield alignment members, wherein each darkspace shield alignment member defines one of said darkspace shield alignment surfaces; and
a plurality of target alignment members, wherein each target alignment member defines one of said target alignment surfaces.

3. The semiconductor fabrication chamber of claim 2 wherein said darkspace shield defines a center axis and said plurality of darkspace shield alignment members are equally spaced from each other and from said darkspace shield center axis.

4. The semiconductor fabrication chamber of claim 3 wherein said target defines a center and said plurality of target alignment members are equally spaced from each other and from said target center.

5. The semiconductor fabrication chamber of claim 4 wherein said darkspace shield center axis is aligned with said target center when said darkspace shield is moved to said second darkspace shield position.

6. The semiconductor fabrication chamber of claim 2 wherein said darkspace shield defines a center axis, said target defines a center and said darkspace shield center axis is aligned with said target center when said darkspace shield is moved to said second darkspace shield position.

7. The semiconductor fabrication chamber of claim 2, wherein each target alignment member is a pin and each darkspace shield alignment member is a bushing which defines a slot shaped to receive a pin.

8. The semiconductor fabrication chamber of claim 7 wherein said darkspace shield defines a center axis, said target defines a center and said darkspace shield center axis is aligned with said target center when said darkspace shield is moved to said second darkspace shield position and wherein each darkspace shield alignment member slot is radially aligned with respect to said darkspace shield center axis.

9. The semiconductor fabrication chamber of claim 7 wherein each darkspace shield alignment member has a recessed lip defining an entrance to said slot.

10. The semiconductor fabrication chamber of claim 2, wherein each darkspace shield alignment member is a pin and each target alignment member is a bushing which defines a slot shaped to receive a pin.

11. The semiconductor fabrication chamber of claim 2, wherein said darkspace shield alignment members are three in number and are circumferentially located on said darkspace shield, and wherein the target alignment members are three in number and are circumferentially located on said target support.

12. The semiconductor fabrication chamber of claim 1, further comprising a darkspace shield support member disposed within said chamber body and adapted to slidingly support said darkspace shield thereon, wherein said darkspace shield is adapted to slide on said darkspace shield support member as said darkspace shield moves between said first shield position and said second shield position.

13. The semiconductor fabrication chamber of claim 1, wherein said target support is a lid, said chamber further comprising a hinge rotatably connecting said lid to said chamber body, wherein said lid has an open orientation and a closed orientation relative to said chamber body, and wherein said target is in said first target position when said lid is in said open orientation, and wherein said target is in said second target position when said lid is in said closed orientation.

14. The semiconductor fabrication chamber of claim 1, wherein said darkspace shield extends circumferentially around said target and defines a darkspace gap between said target and said darkspace shield in said second shield position.

15. The semiconductor fabrication chamber of claim 1, wherein said darkspace shield expands and said darkspace shield alignment surface moves from a first thermally induced darkspace shield position to a second thermally induced darkspace shield position relative to said target as said shield is heated by operation of said chamber, and wherein at least one of said target alignment surface and said shield alignment surface is shaped to define an aperture of sufficient size to permit said shield alignment surface to move between said first and second thermally induced darkspace shield positions relative to said target unobstructed by said target alignment surface.

16. The semiconductor fabrication chamber of claim 7, wherein said darkspace shield is made of a material capable of expansion and contraction in response to a changes in temperature within said chamber, wherein said changes in temperature define a plurality of thermally induced positions for said darkspace shield, wherein each thermally induced position defines a darkspace gap between said darkspace shield and said target, wherein each slot is shaped to permit said shield to move between said thermally induced positions with a pin received in each slot.

17. The semiconductor fabrication chamber of claim 1, wherein said target is installed in said chamber body when said target is in second target position.

18. The semiconductor fabrication chamber of claim 1, wherein said darkspace shield is aligned with respect to said target when said shield is in said second shield position.

19. The semiconductor fabrication chamber of claim 1, wherein said sputterable target surface has a periphery and wherein said shield is aligned with respect to said target when said shield is in said second shield position and defines a darkspace gap around the entire periphery of said sputterable target surface when said target is installed in said chamber body.

20. A target device for a semiconductor fabrication chamber having a darkspace shield, comprising:
a target having a sputterable target surface: and
a target support electrically connected to said target and mechanically supporting said target, said target support having at least one alignment surface adapted to mechanically engage said darkspace shield to align said shield relative to said target, wherein said alignment surface is made of an electrically insulative material.

21. The target device of claim 20 wherein said alignment surface is slot-shaped.

22. A target device for a semiconductor fabrication chamber having a darkspace shield, comprising:
a target having a disk-shaped sputterable target surface which defines a center; and an electrically conductive target support joined and electrically connected to said target and mechanically supporting said target, said target support having at least three pin-shaped alignment surfaces circumferentially located around said sputterable target surface and adapted to mechanically engage said darkspace shield to align said shield relative to said target, each pin being located equidistant from each other and said target surface center.

23. A darkspace shield device for a semiconductor fabrication chamber having a target device having a sputterable target surface, comprising:
a darkspace shield having a ring-shaped shield wall adapted to surround said target sputtering surface and further having at least one alignment surface adapted to be mechanically engaged by said target device to align said shield relative to said target sputterable target surface, wherein said alignment surface is slot-shaped.

24. The shield device of claim 23 wherein said alignment surface is made of an electrically insulative material.

25. A darkspace shield device for a semiconductor fabrication chamber having a target device having a sputterable target surface, comprising:
a darkspace shield having a ring-shaped shield wall defining a center axis and adapted to surround said target sputtering surface and further having at least three electrically insulative bushings circumferentially positioned around said shield wall, each bushing defining a slot-shaped alignment surface adapted to be mechanically engaged by said target device to align said shield relative to said target sputterable target surface, each slot shaped surface being aligned radially with respect to said shield center axis.

26. A method of aligning a darkspace shield to a target in a semiconductor fabrication chamber, comprising:
placing said darkspace shield having a darkspace shield alignment surface in a first shield position in said chamber; and
moving said target having a target alignment surface from a first target position to a second target position with respect to said chamber, wherein said target alignment surface engages said darkspace shield alignment surface and pushes said darkspace shield from said first shield position to a second shield position with respect to said target as said target moves from said first target position to said second target position, wherein said darkspace shield in the second shield position is aligned to said target in the second target position.

27. The method of claim 26, wherein said engaging further comprises inserting a plurality of alignments pins, each pin defining a target alignment surface, into a plurality of slotted insulated bushings, each bushing defining a darkspace shield alignment surface.

28. The method of claim 26, wherein said engaging further comprises inserting a plurality of alignments pins, each pin defining a darkspace shield alignment surface, into a plurality of slotted insulated bushings, each bushing defining a target alignment surface.

29. The method of claim 27, wherein said inserting includes inserting at least one of said alignment pins into at least one said slotted bushing, and
subsequently, inserting at least one of said alignment pins into at least one said slotted bushing.

30. The method of claim 26, wherein moving said target from a first target position to a second target position with respect to said chamber includes rotating said target around a hinge connected to said chamber.

31. A method of aligning a darkspace shield to a target of a target device in a semiconductor fabrication chamber, comprising:
placing said darkspace shield in a first shield position in said chamber wherein said shield includes a ring shaped member adapted to surround said target and having at least three bushings disposed around said ring shaped member, each bushing defining an electrically insulated alignment slot; and
moving said target device from a first target position to a second target position with respect to said chamber to form a darkspace gap between said darkspace shield and said target, wherein said target has a disk-shaped sputtering surface and wherein said target device has at least three alignment pins disposed around said sputtering surface, each alignment pin entering an alignment slot and pushing said darkspace shield to a second shield position which is aligned with respect to said target as said target device is moved from said first target position to said second target position.

32. A semiconductor fabrication chamber, comprising:
a chamber body defining an exterior, an interior and an opening in said chamber body between said chamber exterior and chamber interior;
a removable chamber lid adapted to close said chamber body opening, said lid having a target which has a sputterable target surface, said lid further having at least one target alignment surface;
a darkspace shield having at least one darkspace shield alignment surface adapted to be engaged by said target alignment surface;
at least one fastener adapted to fasten said darkspace shield to said chamber lid;
a plurality of darkspace shield alignment members, wherein each darkspace shield alignment member defines one of said darkspace shield alignment surfaces, wherein said darkspace shield defines a center axis and said plurality of darkspace shield alignment members are equally spaced from each other and from said darkspace shield center axis; and
a plurality of target alignment members, wherein each target alignment member defines one of said target alignment surfaces.

33. The semiconductor fabrication chamber of claim 32 wherein said target defines a center and said plurality of target alignment members are equally spaced from each other and from said target center.

34. The semiconductor fabrication chamber of claim 33 wherein said darkspace shield center axis is aligned with said target center when said darkspace shield alignment surface is engaged by said target alignment surface.

35. The semiconductor fabrication chamber of claim 32 wherein each darkspace alignment member is a pin and each target alignment member is a bushing which defines a slot shaped to receive a pin.

36. A semiconductor fabrication chamber, comprising:
a chamber body defining an exterior, an interior and an opening in said chamber body between said chamber exterior and chamber interior;
a removable chamber lid adapted to close said chamber body opening, said lid having a target which has a sputterable target surface, said lid further having at least one target alignment surface;
a darkspace shield having at least one darkspace shield alignment surface adapted to be engaged by said target alignment surface; and
at least one fastener adapted to fasten said darkspace shield to said chamber lid;
a plurality of darkspace shield alignment members, wherein each darkspace shield alignment member defines one of said darkspace shield alignment surfaces; and
a plurality of target alignment members, wherein each target alignment member defines one of said target alignment surfaces, and wherein each target alignment member is a pin and each darkspace shield alignment member is a bushing which defines a slot shaped to receive a pin.

37. The semiconductor fabrication chamber of claim 36 wherein said darkspace shield defines a center axis, said target defines a center and said darkspace shield center axis is aligned with said target center when said darkspace shield alignment surface is engaged by said target alignment surface and wherein each darkspace shield alignment member slot is radially aligned with respect to said darkspace shield center axis.

38. The semiconductor fabrication chamber of claim 36 wherein each fastener includes a head member disposed on a pin and having a size sufficient to prevent passage of said head member though said slot.

39. The semiconductor fabrication chamber of claim 36, wherein said darkspace shield is made of a material capable of expansion and contraction in response to a changes in temperature within said chamber, wherein said changes in temperature define a plurality of thermally induced positions for said darkspace shield, wherein each thermally induced position defines a darkspace gap between said darkspace shield and said target, wherein each slot is shaped to permit said shield to move between said thermally induced positions with a pin received in each slot.

40. A semiconductor fabrication chamber, comprising:
a chamber body defining an exterior, an interior and an opening in said chamber body between said chamber exterior and chamber interior;
a removable chamber lid adapted to close said chamber body opening, said lid having a target which has a sputterable target surface, said lid further having at least one target alignment surface;
a darkspace shield having at least one darkspace shield alignment surface adapted to be engaged by said target alignment surface;
at least one fastener adapted to fasten said darkspace shield to said chamber lid; and
a darkspace shield support member disposed within said chamber body and adapted to slidingly support said darkspace shield thereon, wherein said darkspace shield is adapted to slide on said darkspace shield support member as said darkspace shield moves in response to thermal expansion and contraction of said shield.

41. A semiconductor fabrication chamber, comprising:
a chamber body defining an exterior, an interior and an opening in said chamber body between said chamber exterior and chamber interior:
a removable chamber lid adapted to close said chamber body opening, said lid having a target which has a sputterable target surface, said lid further having at least one target alignment surface;
a darkspace shield having at least one darkspace shield alignment surface adapted to be engaged by said target alignment surface: and
at least one fastener adapted to fasten said darkspace shield to said chamber lid, wherein said darkspace shield expands and said darkspace shield alignment surface moves from a first thermally induced darkspace shield position to a second thermally induced darkspace shield position relative to said target as said shield is heated by operation of said chamber, and wherein at least one of said target alignment surface and said shield alignment surface is shaped to define an aperture of sufficient size to permit said shield alignment surface to move between said first and second thermally induced darkspace shield positions relative to said target unobstructed by said target alignment surface.

42. An assembly for a semiconductor fabrication chamber, comprising:
a target having a sputterable target surface;
a target support electrically connected to said target and mechanically supporting said target, said target support having at least one target alignment surface; and
a darkspace shield having a ring-shaped shield wall adapted to surround said target sputtering surface and further having at least one alignment surface adapted to be mechanically engaged by said target alignment surface to align said shield relative to said target sputterable target surface, wherein said target alignment surface is made of an electrically insulative material.

43. The assembly of claim 42 wherein said target alignment surface is slot-shaped.

44. The assembly of claim 42 wherein said shield alignment surface is made of an electrically insulative material.

45. The assembly of claim 42 wherein said shield alignment surface is slot-shaped.

46. A method of aligning a darkspace shield to a target in a semiconductor fabrication chamber, comprising:

fastening a darkspace shield having a darkspace shield alignment surface to a target support supporting a target, said support having a target alignment surface which engages said darkspace shield alignment surface and aligns said darkspace shield with respect to said target; and moving said target support from a first target support position to a second target support position so that said target and said darkspace shield fastened to said target support are installed in said chamber, wherein said fastening further comprises inserting a plurality of alignment pins, each pin defining a target alignment surface, into a plurality of slotted insulated bushings, each bushing defining a darkspace shield alignment surface.

47. A method of aligning a darkspace shield to a target in a semiconductor fabrication chamber, comprising:

fastening a darkspace shield having a darkspace shield alignment surface to a target support supporting a target, said support having a target alignment surface which engages said darkspace shield alignment surface and aligns said darkspace shield with respect to said target; and moving said target support from a first target support position to a second target support position so that said target and said darkspace shield fastened to said target support are installed in said chamber, wherein said fastening further comprises inserting a plurality of alignment pins, each pin defining a darkspace alignment surface, into a plurality of slotted insulated bushings, each bushing defining a target alignment surface.

* * * * *